(12) United States Patent  (10) Patent No.: US 8,866,300 B1
Sherrer et al.  (45) Date of Patent: Oct. 21, 2014

(54) DEVICES AND METHODS FOR SOLDER FLOW CONTROL IN THREE-DIMENSIONAL MICROSTRUCTURES

(75) Inventors: David W. Sherrer, Radford, VA (US); James R. Reid, Jr., Billerica, MA (US)

(73) Assignee: Nuvotronics, LLC, Radford, VA (US)

( * ) Notice: Subject to any disclaimer, the term of this patent is extended or adjusted under 35 U.S.C. 154(b) by 0 days.

(21) Appl. No.: 13/488,991

(22) Filed: Jun. 5, 2012

Related U.S. Application Data

(60) Provisional application No. 61/493,516, filed on Jun. 5, 2011.

(51) Int. Cl.
*H01L 23/48* (2006.01)
*H02G 15/00* (2006.01)

(52) U.S. Cl.
USPC ............ 257/773; 257/778; 257/779; 257/780; 257/781; 174/73.1; 174/74 R

(58) Field of Classification Search
USPC ....... 428/209, 901; 174/260–261, 73.1, 74 R; 257/773, 775, 779, 778, 780, 781
See application file for complete search history.

(56) References Cited

U.S. PATENT DOCUMENTS

| | | |
|---|---|---|
| 2,812,501 A | 11/1957 | Sommers |
| 2,914,766 A | 11/1959 | Butler |
| 2,997,519 A | 8/1961 | Hines et al. |
| 3,309,632 A | 3/1967 | Trudeau |
| 3,311,966 A | 4/1967 | Henry |
| 3,335,489 A | 8/1967 | Grant |
| 3,352,730 A | 11/1967 | Murch |
| 3,464,855 A | 9/1969 | Quintana |
| 3,560,896 A | 2/1971 | Essinger |
| 3,760,306 A | 9/1973 | Spinner et al. |
| 3,775,844 A | 12/1973 | Parks |
| 3,789,129 A | 1/1974 | Ditscheid |
| 3,791,858 A | 2/1974 | McPherson |
| 3,963,999 A | 6/1976 | Nakajima |
| 4,021,789 A | 5/1977 | Furman |
| 4,075,757 A | 2/1978 | Malm |
| 4,275,944 A | 6/1981 | Sochor |
| 4,348,253 A | 9/1982 | Subbarao |
| 4,365,222 A | 12/1982 | Lampert et al. |
| 4,414,424 A | 11/1983 | Mizoguchi et al. |
| 4,417,393 A | 11/1983 | Becker |
| 4,437,074 A | 3/1984 | Cohen et al. |

(Continued)

FOREIGN PATENT DOCUMENTS

| | | |
|---|---|---|
| CA | 2055116 | 5/1992 |
| DE | 3623093 | 1/1988 |

(Continued)

OTHER PUBLICATIONS

Ali Darwish et al.; Veritcal Balun and Wilkinson Divider; 2002 IEEE MTT-S Digest; pp. 109-112.

(Continued)

*Primary Examiner* — Cathy Lam
(74) *Attorney, Agent, or Firm* — Niels Haun; Dann Dorfman Herrell & Skillman, PC

(57) ABSTRACT

Structures, materials, and methods to control the spread of a solder material or other flowable conductive material in electronic and/or electromagnetic devices are provided.

46 Claims, 11 Drawing Sheets

(56) References Cited

U.S. PATENT DOCUMENTS

| | | | |
|---|---|---|---|
| 4,521,755 A | 6/1985 | Carlson et al. | |
| 4,581,301 A | 4/1986 | Michaelson | |
| 4,591,411 A | 5/1986 | Reimann | |
| 4,641,140 A | 2/1987 | Heckaman | |
| 4,663,497 A | 5/1987 | Reimann | |
| 4,673,904 A | 6/1987 | Landis | |
| 4,700,159 A | 10/1987 | Jones, III | |
| 4,771,294 A | 9/1988 | Wasilousky | |
| 4,808,273 A | 2/1989 | Hua | |
| 4,853,656 A | 8/1989 | Guillou | |
| 4,856,184 A | 8/1989 | Doeling | |
| 4,857,418 A | 8/1989 | Schuetz | |
| 4,876,322 A | 10/1989 | Budde et al. | |
| 4,880,684 A | 11/1989 | Boss | |
| 4,969,979 A | 11/1990 | Appelt et al. | |
| 4,975,142 A | 12/1990 | Iannacone | |
| 5,069,749 A | 12/1991 | Gutierrez | |
| 5,072,201 A | 12/1991 | Devaux et al. | |
| 5,100,501 A | 3/1992 | Blumenthal | |
| 5,119,049 A | 6/1992 | Heller | |
| 5,227,013 A | 7/1993 | Kumar | |
| 5,334,956 A | 8/1994 | Leding et al. | |
| 5,381,157 A | 1/1995 | Shiga | |
| 5,406,235 A | 4/1995 | Hayashi | |
| 5,430,257 A | 7/1995 | Lau et al. | |
| 5,454,161 A | 10/1995 | Beilin et al. | |
| 5,622,895 A | 4/1997 | Frank | |
| 5,633,615 A | 5/1997 | Quan | |
| 5,682,062 A | 10/1997 | Gaul | |
| 5,682,124 A | 10/1997 | Suski | |
| 5,712,607 A | 1/1998 | Dittmer et al. | |
| 5,724,012 A | 3/1998 | Teunisse | |
| 5,746,868 A | 5/1998 | Abe | |
| 5,793,272 A | 8/1998 | Burghartz et al. | |
| 5,814,889 A | 9/1998 | Gaul | |
| 5,860,812 A | 1/1999 | Gugliotti | |
| 5,872,399 A * | 2/1999 | Lee | 257/738 |
| 5,925,206 A | 7/1999 | Boyko | |
| 5,961,347 A | 10/1999 | Hsu | |
| 5,977,842 A | 11/1999 | Brown | |
| 5,990,768 A | 11/1999 | Takahashi et al. | |
| 6,008,102 A | 12/1999 | Alford et al. | |
| 6,027,630 A | 2/2000 | Cohen | |
| 6,054,252 A | 4/2000 | Lundy et al. | |
| 6,180,261 B1 | 1/2001 | Inoue et al. | |
| 6,210,221 B1 | 4/2001 | Maury | |
| 6,228,466 B1 * | 5/2001 | Tsukada et al. | 428/209 |
| 6,294,965 B1 | 9/2001 | Merrill et al. | |
| 6,350,633 B1 | 2/2002 | Lin | |
| 6,388,198 B1 | 5/2002 | Bertin | |
| 6,457,979 B1 | 10/2002 | Dove et al. | |
| 6,465,747 B2 * | 10/2002 | DiStefano et al. | 174/261 |
| 6,466,112 B1 | 10/2002 | Kwon et al. | |
| 6,514,845 B1 * | 2/2003 | Eng et al. | 438/613 |
| 6,518,165 B1 | 2/2003 | Yoon | |
| 6,535,088 B1 | 3/2003 | Sherman et al. | |
| 6,589,594 B1 | 7/2003 | Hembree | |
| 6,600,395 B1 | 7/2003 | Handforth et al. | |
| 6,603,376 B1 | 8/2003 | Handforth et al. | |
| 6,648,653 B2 | 11/2003 | Huang | |
| 6,662,443 B2 | 12/2003 | Chou | |
| 6,677,248 B2 | 1/2004 | Kwon | |
| 6,749,737 B2 | 6/2004 | Cheng | |
| 6,800,360 B2 | 10/2004 | Miyanaga | |
| 6,800,555 B2 * | 10/2004 | Test et al. | 438/687 |
| 6,827,608 B2 | 12/2004 | Hall | |
| 6,850,084 B2 | 2/2005 | Hembree | |
| 6,888,427 B2 | 5/2005 | Sinsheimer et al. | |
| 6,943,452 B2 | 9/2005 | Bertin | |
| 6,971,913 B1 | 12/2005 | Chu | |
| 6,981,414 B2 | 1/2006 | Knowles et al. | |
| 7,005,750 B2 * | 2/2006 | Liu | 257/779 |
| 7,012,489 B2 | 3/2006 | Sherrer et al. | |
| 7,064,449 B2 * | 6/2006 | Lin et al. | 257/786 |
| 7,077,697 B2 | 7/2006 | Kooiman | |
| D530,674 S | 10/2006 | Ko | |
| 7,129,163 B2 | 10/2006 | Sherrer | |
| 7,148,141 B2 | 12/2006 | Shim et al. | |
| 7,148,772 B2 | 12/2006 | Sherrer et al. | |
| 7,165,974 B2 | 1/2007 | Kooiman | |
| 7,217,156 B2 | 5/2007 | Wang | |
| 7,222,420 B2 | 5/2007 | Moriizumi | |
| 7,239,219 B2 | 7/2007 | Brown et al. | |
| 7,252,861 B2 | 8/2007 | Smalley | |
| 7,259,640 B2 | 8/2007 | Brown et al. | |
| 7,400,222 B2 | 7/2008 | Kwon et al. | |
| 7,405,638 B2 | 7/2008 | Sherrer et al. | |
| 7,449,784 B2 | 11/2008 | Sherrer et al. | |
| 7,478,475 B2 | 1/2009 | Hall | |
| 7,508,065 B2 | 3/2009 | Sherrer et al. | |
| 7,575,474 B1 | 8/2009 | Dodson | |
| 7,579,553 B2 | 8/2009 | Moriizumi | |
| 7,602,059 B2 | 10/2009 | Nobutaka | |
| 7,649,432 B2 | 1/2010 | Sherrer et al. | |
| 7,656,256 B2 | 2/2010 | Houck et al. | |
| 7,658,831 B2 | 2/2010 | Mathieu et al. | |
| 7,705,456 B2 | 4/2010 | Hu | |
| 7,755,174 B2 | 7/2010 | Rollin et al. | |
| 7,898,356 B2 | 3/2011 | Sherrer et al. | |
| 7,948,335 B2 | 5/2011 | Sherrer et al. | |
| 8,011,959 B1 | 9/2011 | Tsai | |
| 8,031,037 B2 | 10/2011 | Sherrer et al. | |
| 8,304,666 B2 | 11/2012 | Ko | |
| 8,339,232 B2 | 12/2012 | Lotfi | |
| 8,441,118 B2 | 5/2013 | Hua | |
| 8,522,430 B2 | 9/2013 | Kacker | |
| 8,542,079 B2 | 9/2013 | Sherrer | |
| 2002/0075104 A1 | 6/2002 | Kwon et al. | |
| 2003/0029729 A1 | 2/2003 | Cheng et al. | |
| 2003/0052755 A1 | 3/2003 | Barnes et al. | |
| 2003/0117237 A1 | 6/2003 | Niu | |
| 2003/0221968 A1 | 12/2003 | Cohen | |
| 2003/0222738 A1 | 12/2003 | Brown et al. | |
| 2004/0004061 A1 | 1/2004 | Merdan | |
| 2004/0007468 A1 | 1/2004 | Cohen | |
| 2004/0007470 A1 | 1/2004 | Smalley | |
| 2004/0038586 A1 | 2/2004 | Hall | |
| 2004/0076806 A1 | 4/2004 | Miyanaga et al. | |
| 2004/0196112 A1 | 10/2004 | Welbon | |
| 2004/0263290 A1 | 12/2004 | Sherrer et al. | |
| 2005/0030124 A1 | 2/2005 | Okamoto et al. | |
| 2005/0045484 A1 | 3/2005 | Smalley et al. | |
| 2005/0156693 A1 | 7/2005 | Dove et al. | |
| 2005/0230145 A1 | 10/2005 | Ishii et al. | |
| 2005/0250253 A1 | 11/2005 | Cheung | |
| 2008/0191817 A1 | 8/2008 | Sherrer | |
| 2008/0199656 A1 | 8/2008 | Nichols et al. | |
| 2008/0240656 A1 | 10/2008 | Rollin et al. | |
| 2009/0154972 A1 | 6/2009 | Tanaka et al. | |
| 2010/0015850 A1 | 1/2010 | Stein | |
| 2010/0109819 A1 | 5/2010 | Houck et al. | |
| 2010/0296252 A1 | 11/2010 | Rollin et al. | |
| 2011/0123783 A1 | 5/2011 | Sherrer | |
| 2011/0181376 A1 | 7/2011 | Vanhille et al. | |
| 2011/0181377 A1 | 7/2011 | Vanhille et al. | |
| 2011/0210807 A1 | 9/2011 | Sherrer et al. | |
| 2011/0273241 A1 | 11/2011 | Sherrer et al. | |
| 2013/0050055 A1 | 2/2013 | Paradiso et al. | |
| 2013/0127577 A1 | 5/2013 | Lotfi | |

FOREIGN PATENT DOCUMENTS

| | | |
|---|---|---|
| EP | 398019 | 4/1990 |
| EP | 485831 | 5/1992 |
| EP | 845831 | 6/1998 |
| EP | 911903 | 4/1999 |
| FR | 2086327 | 12/1971 |
| JP | 3027587 | 2/1991 |
| JP | 6085510 | 3/1994 |
| JP | 6302964 | 10/1994 |
| JP | H10041710 | 2/1998 |
| TW | I244799BB | 12/2005 |
| WO | 0007218 | 2/2000 |
| WO | 0039854 | 7/2000 |

(56) References Cited

FOREIGN PATENT DOCUMENTS

| WO | 0206152 | 1/2002 |
|---|---|---|
| WO | 02080279 | 10/2002 |
| WO | 2004004061 | 1/2004 |

OTHER PUBLICATIONS

Brown et al., "A Low-Loss Ka-Band Filter in Rectangular Coax Made by Electrochemical Fabrication", submitted to Microwave and Wireless Components Letters, date unknown (downloaded from www.memgen.com, 2004).

Chwomnawang et al., "On-chip 3D Air Core Micro-Inductor for High-Frequency Applications Using Deformation of Sacrificial Polymer", Proc. SPIE, vol. 4334, pp. 54-62, Mar. 2001.

Cole, B.E., et al., Micromachined Pixel Arrays Integrated with CMOS for Infrared Applications, pp. 64-64 (2000).

De Los Santos, H.J., Introduction to Microelectromechanical (MEM) Microwave Systems (pp. 4, 7-8, 13) (1999).

Deyong, C., et al., A Microstructure Semiconductor Thermocouple for Microwave Power Sensors, 1997 Asia Pacific Microwave Conference, pp. 917-919.

Elliott Brown/MEMGen Corporation, "RF Application of EFAB Technology", MTT-S IMS 2003, pp. 1-15.

Engelmann et al., "Fabrication of High Depth-to-Width Aspect Ratio Microstructures", IEEE Micro Electro Mechanical Systems (Feb. 1992), pp. 93-98.

Sherrer, D, Vanhille, K, Rollin, J.M., "PolyStrata Technology: A Disruptive Approach for 3D Microwave Components and Modules," Presentation (Apr. 23, 2010).

European Examination Report dated Mar. 21, 2013 for EP Application No. 07150463.3.

Flipovic, et al., "Modeling, Design, Fabrication, and Performance of Rectangular u-Coaxial Lines and Components", Microwave Symposium Digest, 2006, IEEE; Jun. 1, 2006; pp. 1393-1396.

Franssila, S., Introduction to Microfabrication, (pp. 8) (2004).

Frazier et al., "Metallic Microstructures Fabricated Using Photosensitive Polyimide Electroplating Molds", Journal of Microelectromechanical Systems, vol. 2, No. 2, Jun. 1993, pp. 87-94.

Ghodisian, B., et al., Fabrication of Affordable Metallic Microstructures by Electroplating and Photoresist Molds, 1996, pp. 68-71.

H. Guckel, "High-Aspect-Ratio Micromachining Via Deep X-Ray Lithography", Proc. of IEEE, vol. 86, No. 8 (Aug. 1998), pp. 1586-1593.

Jeong, Inho et al., "High-Performance Air-Gap Transmission Lines and Inductors for Millimeter-Wave Applications", IEEE Transactions on Microwave Theory and Techniques, Dec. 2002, pp. 2850-2855, vol. 50, No. 12.

Katehi et al., "MEMS and Si Micromachined Circuits for High-Frequency Applications", IEEE Transactions on Microwave Theory and Techniques, vol. 50, No. 3, Mar. 2002, pp. 858-866.

Kenneth J. Vanhille et al.; Micro-Coaxial Imedance Transformers; Journal of Latex Class Files; vol. 6; No. 1; Jan. 2007.

Kwok, P.Y., et al., Fluid Effects in Vibrating Micromachined Structures, Journal of Microelectromechanical Systems, vol. 14, No. 4, Aug. 2005, pp. 770-781.

Lee et al., "Micromachining Applications of a High Resolution Ultrathick Photoresist", J. Vac. Sci. Technol. B 13 (6), Nov./Dec. 1995, pp. 3012-3016.

Loechel et al., "Application of Ultraviolet Depth Lithography for Surface Micromachining", J. Vac. Sci. Technol. B 13 (6), Nov./Dec. 1995, pp. 2934-2939.

Madou, M.J., Fundamentals of Microfabrication: The Science of Miniaturization, 2d Ed., 2002 (Roadmap; pp. 615-668).

Park et al., "Electroplated Micro-Inductors and Micro-Transformers for Wireless application", IMAPS 2002, Denver, CO, Sep. 2002.

Sedky, S., Post-Processing Techniques for Integrated MEMS (pp. 9, 11, 164) (2006).

Tummala et al.; "Microelectronics Packaging Handbook"; Jan. 1, 1989; XP002477031; pp. 710-714.

Yeh, J.L., et al., Copper-Encapsulated Silicon Micromachined Structures, Journal of Microelectromechanical Systems, vol. 9, No. 3, Sep. 2000, pp. 281-287.

Yoon et al., "3-D Lithography and Metal Surface Micromachining for RF and Microwave MEMs" IEEE MEMS 2002 Conference, Las Vegas, NV, Jan. 2002, pp. 673-676.

Yoon et al., "CMOS-Compatible Surface Micromachined Suspended-Spiral Inductors for Multi-GHz Sillicon RF Ics", IEEE Electron Device Letters, vol. 23, No. 10, Oct. 2002, pp. 591-593.

Yoon et al., "High-Performance Electroplated Solenoid-Type Integrated Inductor (SI2) for RF Applications Using Simple 3D Surface Micromachining Technology", Int'l Election Devices Meeting, 1998, San Francisco, CA, Dec. 6-9, 1998, pp. 544-547.

Yoon et al., "High-Performance Three-Dimensional On-Chip Inductors Fabricated by Novel Micromahining Technology for RF MMIC", 1999 IEEE MTT-S Int'l Microwave Symposium Digest., vol. 4, Jun. 13-19, 1999, Anaheim, California, pp. 1523-1526.

Yoon et al., "Monolithic High-Q Overhang Inductors Fabricated on Silicon and Glass Substrates", International Electron Devices Meeting, Washington D.C. (Dec. 1999), pp. 753-756.

Yoon et al., "Monolithic Integration of 3-D Electroplated Microstructures with Unlimited Number of Levels Using Planarization with a Sacrificial Metallic Mole (PSMm)", Twelfth IEEE Int'l Conf. on Micro Electro mechanical systems, Orlando Florida, Jan. 1999, pp. 624-629.

Yoon et al., "Multilevel Microstructure Fabrication Using Single-Step 3D Photolithography and Single-Step Electroplating", Proc. of SPIE, vol. 3512, (Sep. 1998), pp. 358-366.

Saito, Y., Fontaine, D., Rollin, J-M., Filipovic, D., "Micro-Coaxial Ka-Band Gysel Power Dividers," Microwave Opt Technol Lett 52: 474-478, 2010.

Hawkins, C.F., The Microelectronics Failure Analysis, Desk Reference Edition (2004). NPL_11.

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Immorlica, Jr., T. et al., "Miniature 3D micro-machined solid state power amplifiers," COMCAS 2008.

Ehsan, N. et al., "Microcoaxial lines for active hybrid-monolithic circuits," 2009 IEEE MTT-S Int. Microwave.Symp. Boston, MA, Jun. 2009.

Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.

Filipovic, D.S., "Design of microfabricated rectangular coaxial lines and components for mm-wave applications," Microwave Review, vol. 12, No. 2, Nov. 2006, pp. 11-16.

Ingram, D.L. et al., "A 427 mW 20% compact W-band InP HEMT MMIC power amplifier," IEEE RFIC Symp. Digest 1999, pp. 95-98.

Lukic, M. et al., "Surface-micromachined dual Ka-band cavity backed patch antennas," IEEE Trans. AtennasPropag., vol. 55, pp. 2107-2110, Jul. 2007.

Oliver, J.M. et al., "A 3-D micromachined W-band cavity backed patch antenna array with integrated rectacoax transition to wave guide," 2009 Proc. IEEE International Microwave Symposium, Boston, MA 2009.

Rollin, J.M. et al., "A membrane planar diode for 200GHz mixing applications," 29th International Conference on Infrared and Millimeter Waves and Terahertz Electronics, pp. 205-206, Karlsrube, 2004.

Rollin, J.M. et al., "Integrated Schottky diode for a sub-harmonic mixer at millimetre wavelengths," 31st International Conference on Infrared and Millimeter Waves and Terahertz Electronics, Paris, 2006.

Saito et al., "Analysis and design of monolithic rectangular coaxial lines for minimum coupling," IEEE Trans. Microwave Theory Tech., vol. 55, pp. 2521-2530, Dec. 2007.

Vanhille, K. et al., "Balanced low-loss Ka-band μ-coaxial hybrids," IEEE MTT-S Dig., Honolulu, Hawaii, Jun. 2007.

(56) References Cited

OTHER PUBLICATIONS

Vanhille, K. et al., "Ka-Band surface mount directional coupler fabricated using micro-rectangular coaxial transmission lines," 2008 Proc. IEEE International Microwave Symposium, 2008.
Vanhille, K.J. et al., "Ka-band miniaturized quasi-planar high-Q resonators," IEEE Trans. Microwave Theory Tech., vol. 55, No. 6, pp. 1272-1279, Jun. 2007.
Vyas R. et al., "Liquid Crystal Polymer (LCP): The ultimate solution for low-cost RF flexible electronics and antennas," Antennas and Propagation Society, International Symposium, p. 1729-1732 (2007).
Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.
Wang, H. et al., "Power-amplifier modules covering 70-113 GHz using MMICs," IEEE Trans Microwave Theory and Tech., vol. 39, pp. 9-16, Jan. 2001.
Vanhille, K., "Design and Characterization of Microfabricated Three-Dimensional Millimeter-Wave Components," Dissertation, 2007.
Ehsan, N., "Broadband Microwave Litographic 3D Components," Dissertation 2009.
Colantonio, P., et al., "High Efficiency RF and Microwave Solid State Power Amplifiers," pp. 380-395, 2009.
European Examination Report of corresponding European Patent Application No. 08 15 3144 dated Apr. 6, 2010.
European Examination Report of corresponding European Patent Application No. 08 15 3144 dated Feb. 22, 2012.
European Examination Report of corresponding European Patent Application No. 08 15 3144 dated Nov. 10, 2008.
European Search Report for corresponding EP Application No. 07150463.3 dated Apr. 23, 2012.
European Search Report of Corresponding European Application No. 07 15 0467 mailed Apr. 28, 2008.
European Search Report of corresponding European Application No. 08 15 3138 mailed Jul. 4, 2008.
European Search Report of corresponding European Application No. 08153138.6 mailed Jul. 15, 2008.
European Search Report of corresponding European Patent Application No. 08 15 3144 dated Jul. 2, 2008.
International Preliminary Report on Patentability dated Jul. 24, 2012 for corresponding PCT/US2011/022173.
International Preliminary Report on Patentability dated May 19, 2006 on corresponding PCT/US04/06665.
International Search Report dated Aug. 29, 2005 on corresponding PCT/US04/06665.
Jeong, I., et al., "High Performance Air-Gap Transmission Lines and Inductors for Milimeter-Wave Applications", Transactions on Microwave Theory and Techniques, vol. 50, No. 12, Dec. 2002.
PwrSoC Update 2012: Technology, Challenges, and Opportunities for Power Supply on Chip, Presentation (Mar. 18, 2013).
Written Opinion of the International Searching Authority dated Aug. 29, 2005 on corresponding PCT/US04/06665.
Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.

* cited by examiner

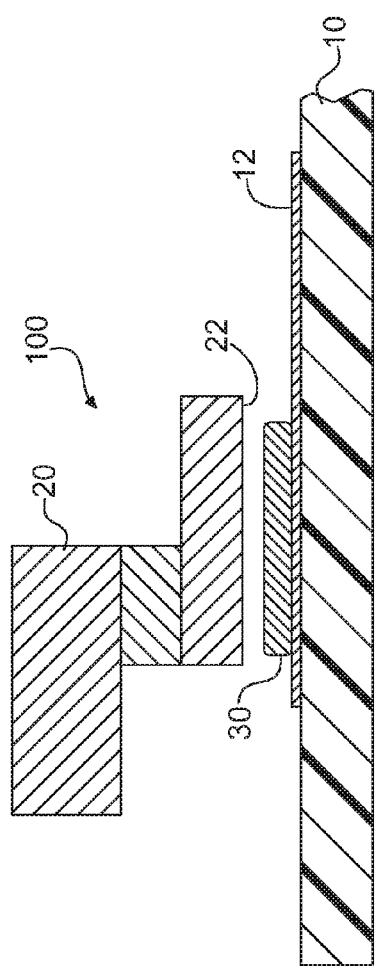
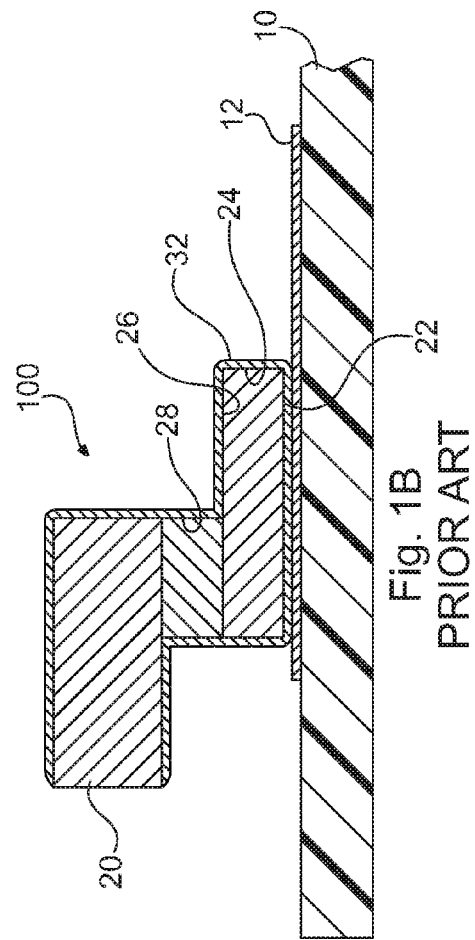
Fig. 1A PRIOR ART
Fig. 1B PRIOR ART

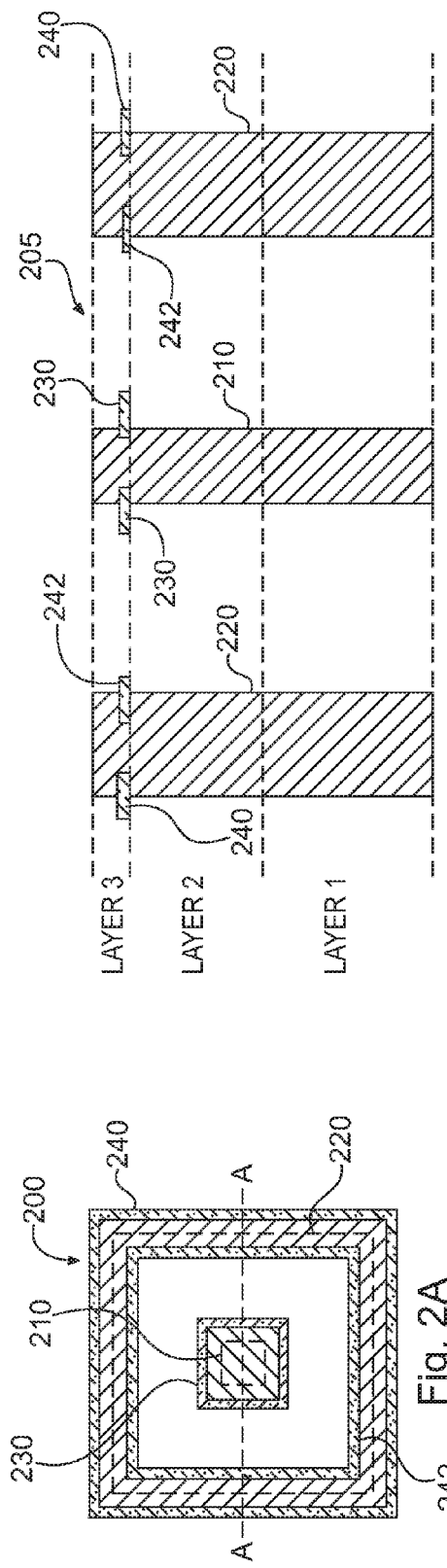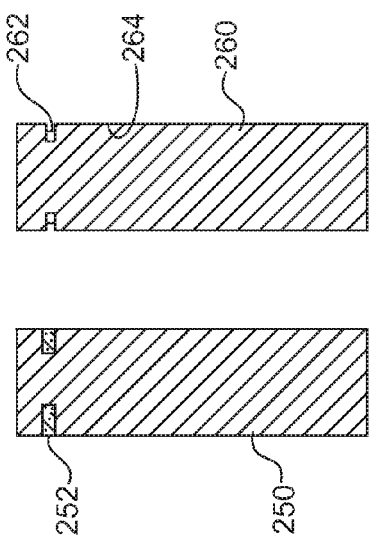

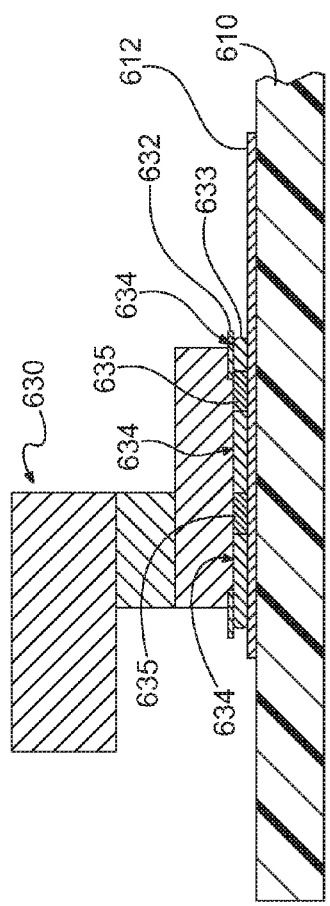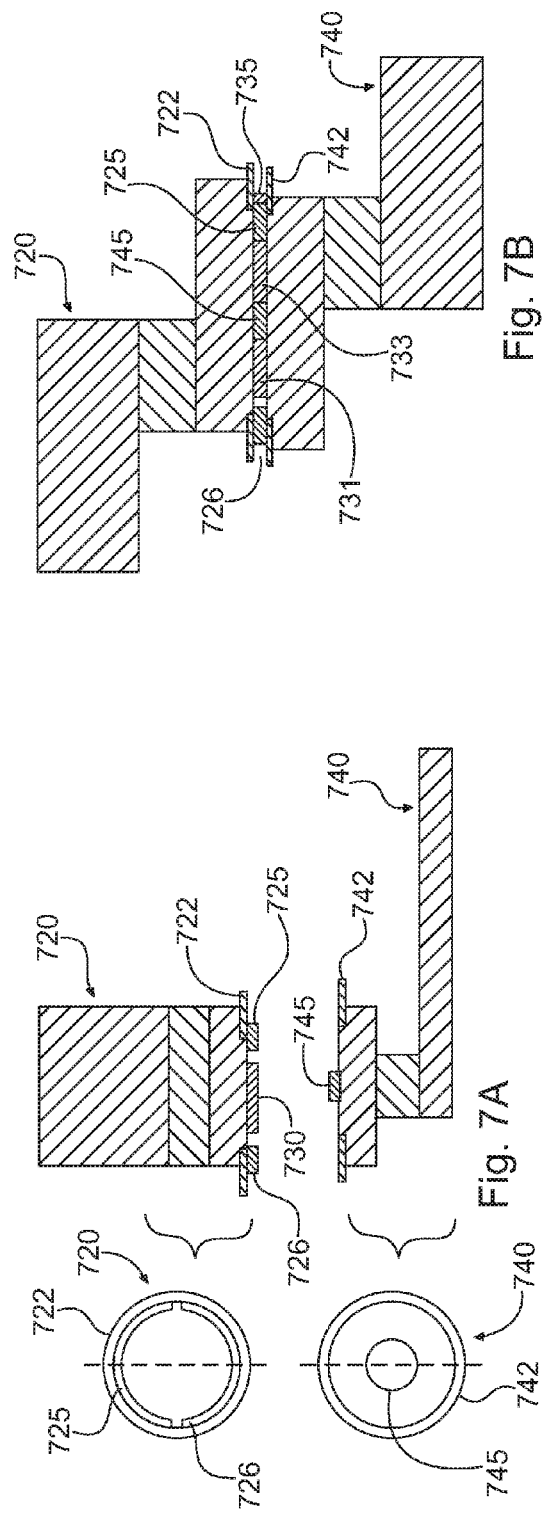

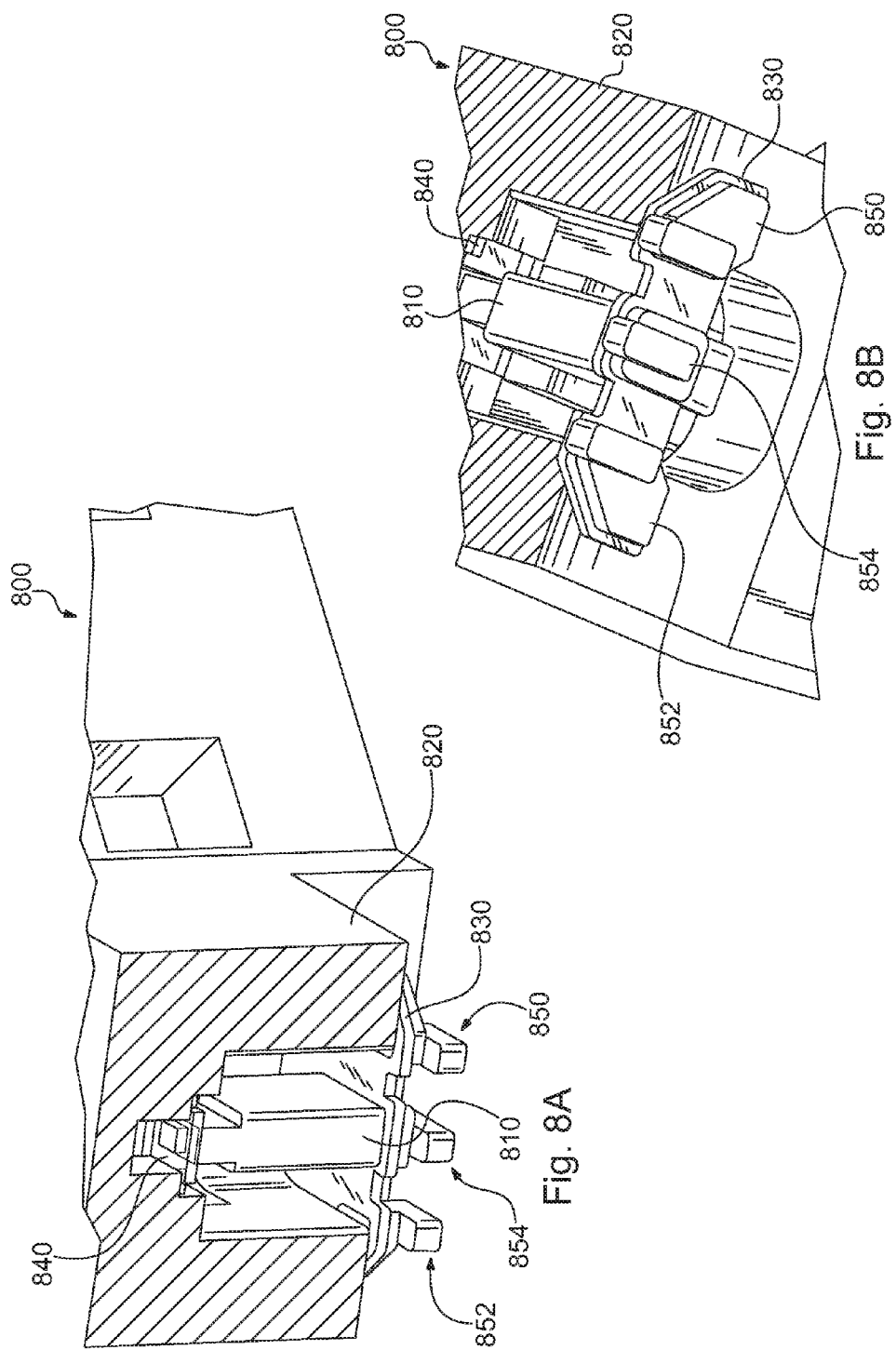

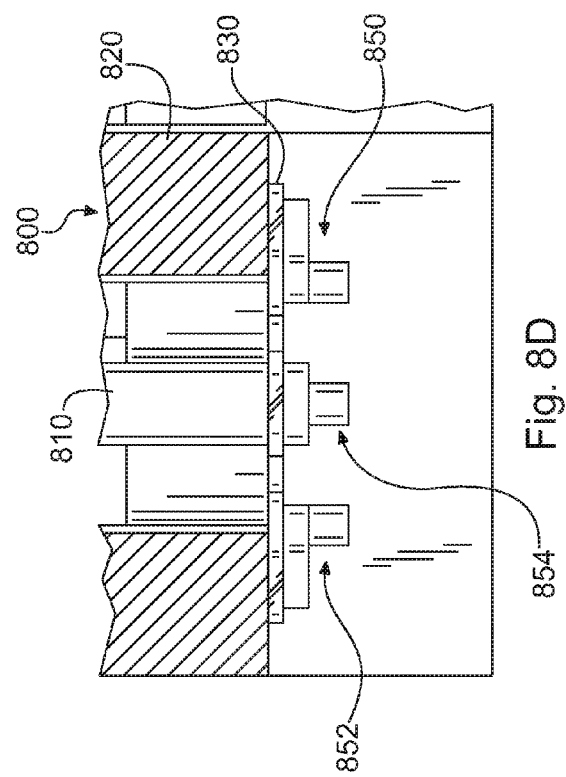
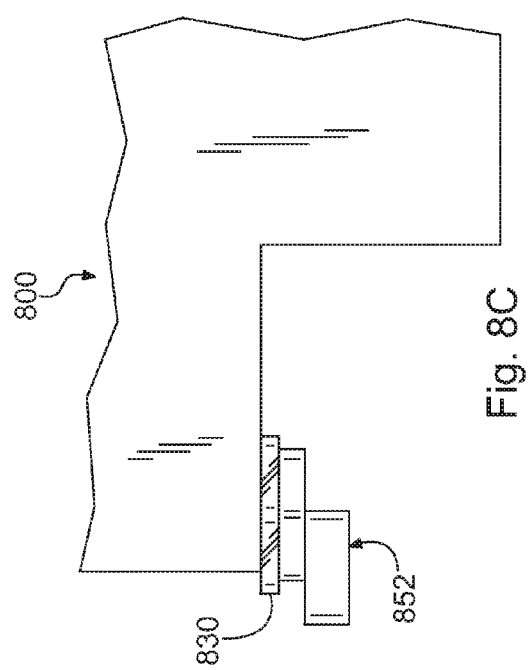

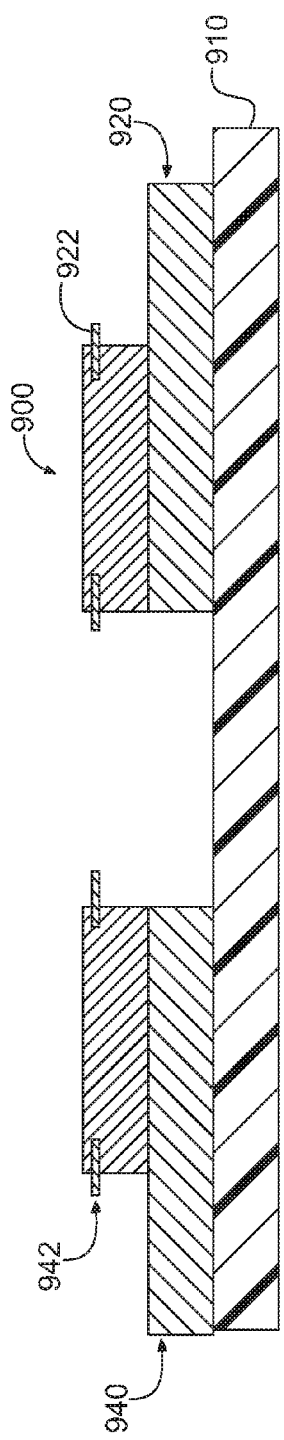
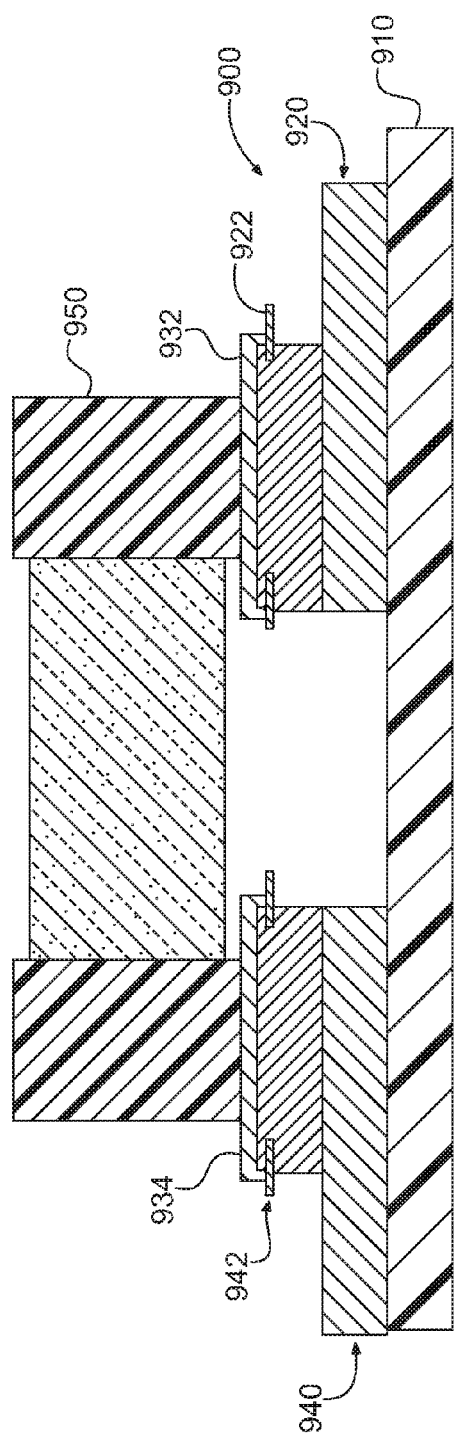

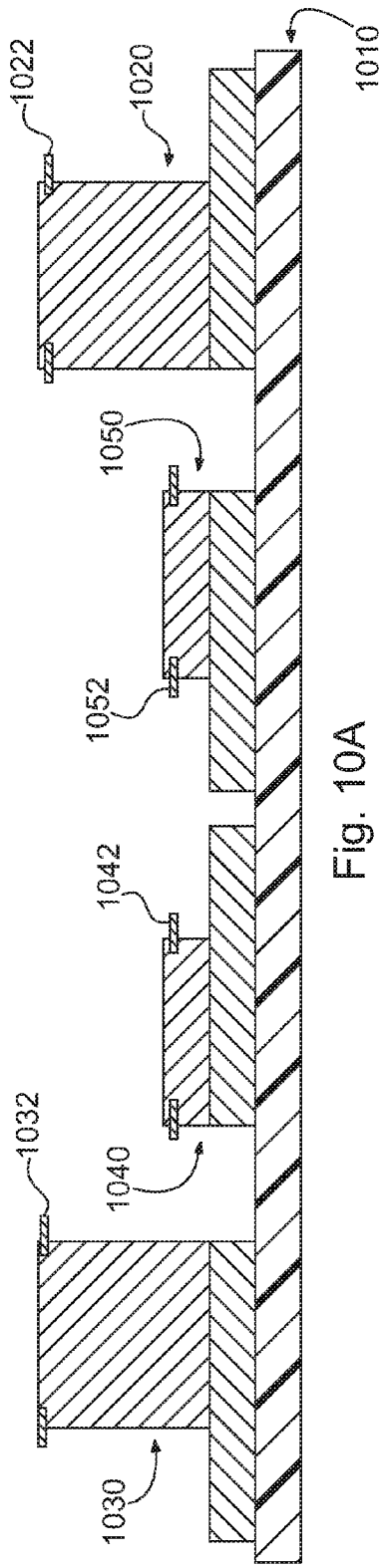
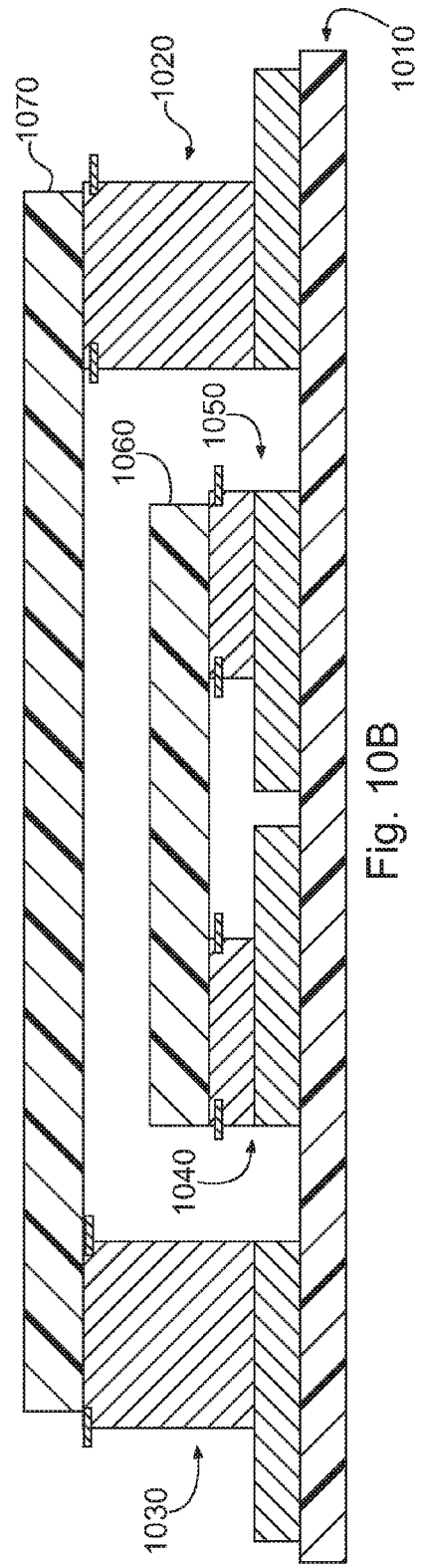
Fig. 10A
Fig. 10B

DEVICES AND METHODS FOR SOLDER FLOW CONTROL IN THREE-DIMENSIONAL MICROSTRUCTURES

RELATED APPLICATIONS

This application claims the benefit of priority of U.S. Provisional Application No. 61/493,516, filed on Jun. 5, 2011, the entire contents of which application are incorporated herein by reference.

FIELD OF THE INVENTION

The present invention relates generally to control of the flow of a conductive material in electric, electronic and/or electromagnetic devices, such as three-dimensional microstructures (e.g., waveguide structures), and more particularly, but not exclusively, to structures, materials, and methods to control the spread of a solder material or other flowable conductive material, such as a conductive epoxy.

BACKGROUND OF THE INVENTION

With increasing demands on computational power and data transmission bandwidth, electronic devices and microstructures incorporating such devices are becoming increasingly complex necessitating a greater degree of mechanical and electrical interconnection among components. In response, three-dimensional microstructures provide a variety of advantages in accommodating the need for increased device performance. By way of example, three-dimensional microstructures and methods for their manufacture are illustrated at least at U.S. Pat. Nos. 7,948,335, 7,405,638, 7,148,772, 7,012,489, 7,649,432, 7,656,256, 7,755,174, 7,898,356, 8,031,037 and/or U.S. Application Pub. Nos. 2010/0109819, 2011/0210807, 2010/0296252, 2011/0273241, 2011/0123783, 2011/0181376 and/or 2011/0181377, each of which is hereby incorporated by reference in their entirety.

A typical approach for electrically and/or mechanically interconnecting both planar and three-dimensional microstructures is soldering. However, it may be difficult to stop solder from wicking up the length of a metal component, especially in view of the complex surface morphologies which may be encountered in three-dimensional microstructures, and particularly when such structures are made of or coated with metals such as gold, silver, copper or similar metals which are capable of promoting solder flow. For instance, the presence of a multitude of discrete components, mounting surfaces, interconnected chips, and so on presents a variety of surface height changes and void spaces prone to wicking molten solder along the surfaces of such components.

While the phenomena of adhesion of a desired solder to base metal may be called "wetting" and lack of it as "non-wetting", for the purposes of the present application the term "wicking" is defined to connote the flow (intended or unintended) of solder along the surface of parts, even though the physics of the flow is not one of traditional fluidic "wicking" in the sense as it occurs when a fabric contacts water. Wicking therefore in the context of the present application is the wetting of the solder, and to stop the wicking in the present application refers to stopping of wetting and flow of the solder past the intended boundaries. A clean thin layer of gold on platinum, intended for solder reflow, may for example, continue to wet the surface particularly in non-oxidizing conditions for a great distance until the solder thickness or composition due to interdiffusion becomes unacceptable for its intended purpose.

The unintended flow of solder throughout such microstructures may cause decreased performance, uncontrolled bond lines, shorting, solder embrittlement, and other problems. In traditional planar structures such as circuit boards control of the solder flow can be performed with a patterned solder mask. Often such materials are either selectively applied or patterned, e.g., photo-patterned, or they may be microsprayed. Whereas a "solder mask", such as a patterned planar dielectric coating, may be used to stop and/or control solder flow, in an open three-dimensional structure applying such a material may be relatively difficult to achieve for multiple reasons. First, the interconnects and/or electrical junctions where devices are to be attached may be on a layer other than the surface layer, precluding the use of dry film. Second, a complex three-dimensional structure may be hard to coat and/or pattern lithographically on more than one layer. Third, it may be desirable to ensure substantially complete removal of any existing solder mask materials as they may degrade performance such as RF performance, because they may not be applied with sufficient accuracy and/or quantity for many applications (e.g., microwave devices) onto such three-dimensional structures. These problems are aggravated when the desired pad dimensions for a solder or conductive adhesive continue to shrink from squares of hundreds of microns on a side to squares of tens of microns, as currently is the case for some microwave and mm-wave devices and circuits such as MMICs.

In addition, three-dimensional microstructures may include coatings of excellent conductors and/or noble metals, such as gold, which may aggravate a problem of solder flowing along a conductor in an uncontrolled manner. Further, solder thickness and even conductive adhesive thickness, as well as volume, in a particular location often need to be controlled as the these parameters can determine mechanical properties such as strength and resistance to fatigue. Maintaining the solder's reflow over a controlled location during attach can provide compositional control of the metals in the solder system as noble metals, diffusion barriers, and base metals tend to dissolve to varying degrees and therefore impact lifetime and other properties of the electro-mechanical junctions at the points of attach. Still, solder attach may be an important technique for high strength and reliable device attachment. Previous approaches for three-dimensional microstructures have failed to disclose how to maintain adhesion of such coatings particularly when the CTE match of the wettable metals and the non-wettable layers or "wick stop" materials may be highly mismatched. Thus, there remains a need to control flow, wetting area, and/or spread of solder material for three-dimensional micro-electric structures including, for example, those incorporated herein by reference above.

SUMMARY OF THE INVENTION

In one of its aspects, the present invention provides exemplary devices and methods in which mechanical interlocking the of the layers by overlapping their boundaries in three-dimensional cross-section provides mechanical and positional stability despite the large change in temperature associated with reflowing a material such as solder would induce, which can be on the order of 200° C. or more. In this regard, the present invention provides devices and methods in which reliance on chemical adhesion alone to keep the materials intact is not required.

For example, the present invention may provide an electronic microstructure having a mounting surface having at least a portion thereof configured to bond to one or more of a metallic solder and a conductive epoxy. A wick stop structure may be disposed away from the mounting surface at a location on the microstructure proximate the mounting surface, and may be configured to deter the flow of one or more of the metallic solder and the conductive epoxy from the mounting surface to a location on the microstructure beyond the location of the wick stop structure. In this regard, the wick stop structure may comprise a material which is non-wetting to metallic solder and may include a dielectric or a non-wetting metal, such as nickel. The wick stop structure may include a shelf which extends outwardly away from a surface of the microstructure at which the shelf is located and/or may have a portion disposed within the microstructure. Additionally or alternatively, the shelf may circumscribe a portion or all of the microstructure.

In a further aspect, the present invention may provide a method of forming an electronic microstructure comprising depositing a plurality of layers over a substrate, where the layers comprise one or more of a metal material, a sacrificial photoresist material, and a dielectric material, thereby forming an electronic microstructure above the substrate. The microstructure may include a mounting surface having at least a portion thereof configured to bond to one or more of a metallic solder and a conductive epoxy, and a wick stop structure disposed away from the mounting surface at a location on the microstructure proximate the mounting surface. The wick stop structure may be configured to deter the flow of one or more of the metallic solder and the conductive epoxy from the mounting surface to a location on the microstructure beyond the location of the wick stop structure. The microstructure may be remove from the substrate to provide a freestanding part.

BRIEF DESCRIPTION OF THE DRAWINGS

The foregoing summary and the following detailed description of the exemplary embodiments of the present invention may be further understood when read in conjunction with the appended drawings, in which:

FIGS. 1A and 1B schematically illustrate in side cross-section a portion of a microstructure and a substrate or second structure, pre- and post-soldering, respectively, demonstrating problematic solder flow to unintended microstructure locations;

FIGS. 2A-2C schematically illustrate a top view and side cross-sectional views, respectively, of exemplary wick stop structures in accordance with the present invention;

FIG. 6 schematically illustrates a side cross-sectional view of a further exemplary three-dimensional microstructure incorporating wick stop structures and solder gap-setting structures in accordance with the present invention;

FIGS. 7A and 7B schematically illustrate exemplary three-dimensional microstructure junctions incorporating wick stop structures and solder gap-setting structures in accordance with the present invention;

FIGS. 8A and 8B schematically illustrate isometric views in partial cross-section of a coax to ground-signal-ground (G-S-G) microstructure in accordance with the present invention;

FIGS. 8C and 8D schematically illustrate a side view and front elevational view in partial cross-section, respectively, of the coax to G-S-G microstructure of FIGS. 8A and 8B;

FIGS. 9A and 9B schematically illustrate side cross-sectional views of a SMT 2-ended device such as a resistor, pre- and post-soldering, respectively, along with exemplary microstructures comprising wick stops in accordance with the present invention; and FIGS. 10A and 10B schematically illustrate side cross-sectional views, pre- and post-soldering, respectively, of exemplary multi-layer flip chip mounting microstructures comprising wick stops in accordance with an aspect of the present invention.

DETAILED DESCRIPTION OF THE INVENTION

Figure 3C:
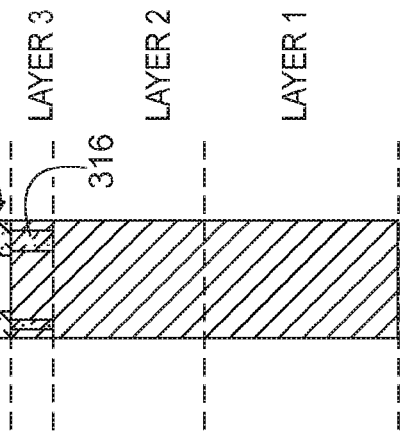
FIGS. 3A-3C schematically illustrate side cross-sectional views of further exemplary wick stop structures in accordance with the present invention.

Referring now to the figures, wherein like elements are numbered alike throughout, an aspect of the present invention may be understood by reference to FIGS. 1A-1B in which one of the problems addressed by the present invention is illustrated. FIG. 1A schematically illustrates a device 100 prior to assembly comprising a portion of a three-dimensional microstructure 20 for electrical and/or mechanical connection to a base layer 10, such as a circuit board. The base layer 10 may include a metal component, such as a circuit board trace 12, to which the three-dimensional microstructure 20 is to be attached, and attachment may be effected through the use of a solder 30 disposed between a mounting surface 22 of the three-dimensional microstructure 20 and the circuit board trace 12. The microstructure may for example be comprised of copper with a thin surface coating of nickel and gold as is common for an electrical conductor in microelectronics. Upon heating, the solder 30 is melted and the three-dimensional microstructure 20 is either already in physical contact or brought into physical contact with the molten solder 32 to effect attachment of the three-dimensional microstructure 20 to the circuit board trace 12, FIG. 1B. However, due to the wetting properties of the molten solder 32 relative to the three-dimensional microstructure 20, the solder 32 may flow up or along the surface of the three-dimensional microstructure 20 substantially beyond the mounting surface 22 and coat additional surfaces 24, 26, 28 of the three-dimensional microstructure 20, which were not intended to be coated with the solder 32. The coating of these additional surfaces 24, 26, 28 with the metallic solder 32 has the potential to cause performance loss through reduced conductivity, shorting, uncontrolled bond line thickness, change in composition, etc. Accordingly, in one of its aspects the present invention prevents or deters the unwanted flow of solder onto surfaces and structures which are to remain free of solder.

For instance, in one of the aspects of the present invention, a non-wetting material may be used to control flow, wetting area, and/or spread of a material, such as a solder, thereby substantially minimizing, inhibiting and/or stopping unintentional solder flow. As used throughout the present disclosure, a non-wetting material may include an insulating material, which in turn may include a dielectric material, such as a photopatternable dielectric which may form a solder flow stop. The non-wetting material may also include a secondary metal, such as a plated nickel ring instead of and/or in addition to a dielectric non-wetting material, for example. Nickel may form a non-wetting oxide and/or may stop the solder flow, and may be employed when the required use temperature may exceed the temperature limits of a dielectric and/or may be used where metal to metal bonding in the microstructure is desired. In exemplary configurations of the present invention, the dielectric material may be replaced with a non-wetting metal, for example if such use would not cause shorting between conductors (e.g., circumscribing a metal, but not bridging two conductors as can be done with a dielectric). The non-wetting material may be permanent or non-permanent. For example, when solder wetting control is of concern, a dielectric material may include a selectively soluble material that is able to survive the release process of a sacrificial material used to make a multilayer structure, but which is then dissolved away after release and after the passivation coatings are applied (e.g., electroless nickel followed by electroless gold). When stop material is dissolved at this point, a base metal may be exposed. By applying electroless nickel again, an exposed base metal (e.g., copper) may be made to plate selectively to gold, producing a relatively thin passivated metal ring of non-wetting metal.

The non-wetting material may be grown mechanically into the lines in a multi-layer build, for example using a multi-layer three-dimensional build process and/or any other suitable process. The multilayer build process may desirably include an electrodeposition process, a transfer bonding process, a dispensing process, a lamination process, a solid three-dimensional printing process, a laser-fusion of particles process, a vapor deposition process, a screen printing process, a squeegee process, and/or a pick-and-place process. For example, a sequential build process may include one or more material integration processes employed to form a portion and/or substantially all of an apparatus. The sequential build process may be accomplished through processes including various combinations of: (a) metal material, sacrificial material (e.g., photoresist), insulative material (e.g., dielectric) and/or thermally conductive material deposition processes; (b) surface planarization; (c) photolithography; and/or (d) etching or other layer removal processes. Plating techniques may be useful, although other deposition techniques such as physical vapor deposition (PVD) and/or chemical vapor deposition (CVD) techniques may be employed.

The sequential build process may include disposing a plurality of layers over a substrate, which may include one or more layers of a dielectric material, one or more layers of a metal material and/or one or more layers of a resist material. In exemplary configurations, a first microstructural element, such as a support member and/or a solder flow stop member, may be formed of dielectric material. The support structure and/or a solder flow stop member may include an anchoring portion, such as an aperture extending at least partially therethrough. One or more layers may be etched by any suitable process, for example wet and/or dry etching processes.

The sequential build process may also include depositing one or more layers of thermally conductive materials, which may be deposited at any desired location, for example at substantially the same in-plane location as a layer of the first microstructural element and/or second microstructural element. In addition, one or more layers of thermally conductive material may be deposited at any desired location, for example spaced apart from one or more layers of the first microstructural element and/or second microstructural element.

In conjunction with the present invention any material integration process may be employed to form a part and/or all of an apparatus. For example, one or more of a transfer bonding, lamination, pick-and-place, deposition transfer (e.g., slurry transfer), and electroplating on or over a substrate layer (which may be mid-build of a process flow) may be employed. A transfer bonding process may include affixing a first material to a carrier substrate, patterning a material, affixing a patterned material to a substrate, and/or releasing a carrier substrate. A lamination process may include patterning a material before and/or after a material is laminated to a substrate layer and/or any other desired layer. A material may be supported by a support lattice to suspend it before it is laminated, and then it may be laminated to a layer or the material may be selectively dispensed. The material may include a layer of a material and/or a portion of an apparatus, for example pick-and-placing one or more waveguide structures on and/or over a conductive surface.

In certain instances, adhesion between a dielectric and metal may not be required, for example where elements may be mechanically constrained. In such a case, the dielectric material may remain a permanent part of a structure. For example, a non-wetting material, such as a dielectric solder flow stop member, may circumscribe a metal element, as a sheet and/or a perforated sheet. For cases where a sheet is included, the sheet may form the base of a BGA (ball grid array)-like package, which may enable QFN (quad-flat no-lead)-like and/or similar structures including maximized RF performance, higher complexity, small pitch, etc.

In a further example of the structures to which the present invention may be applied, a metal material may be deposited in an aperture of a first microstructural element, affixing the first microstructural element to a second microstructural element. For example when an anchoring portion includes a re-entrant profile, a first microstructural element may be affixed to a second microstructural element by forming a layer of a second microstructural element on a layer of a first microstructural element. Sacrificial material may be removed to form a non-solid volume, which may be occupied by a gas such as air or sulfur hexafluoride, a void, or a liquid, and/or to which a first microstructural element, second microstructural element and/or thermal member may be exposed. The non-solid volume may be filled with dielectric material, and an insulative material may be disposed between any one of a first microstructural element, a second microstructural element and/or a thermal manager.

As an illustrative use of the aforementioned materials, structures, and methods of the present invention, a coaxial microstructure 200 is illustrated in FIGS. 2A, 2B. The coaxial microstructure 200 may include non-wetting wick stop shelves 230, 240, 242 to circumscribe device components, such as center and outer conductors 210, 220, to inhibit, minimize, and/or stop the wetting flow of solder beyond the region intended to be coated with solder, such as an end portion 205 of the coaxial microstructure 200, thereby addressing problems associated with the uncontrolled flow of solder. Since the outer conductor 220 may typically comprise a hollow structure surrounding the center conductor 210, the outer conductor 220 may be provided with both an interior wick stop shelf 242 and an exterior wick stop shelf 240 to deter or prevent the flow of solder on either side of the outer conductor 220.

Figure 3B:
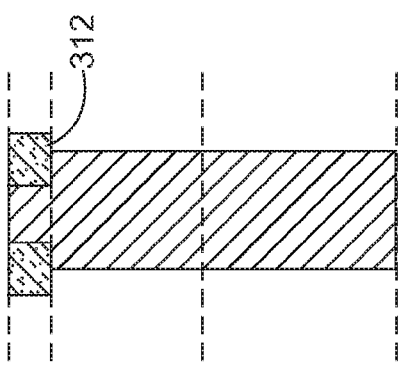
Figure 3A:
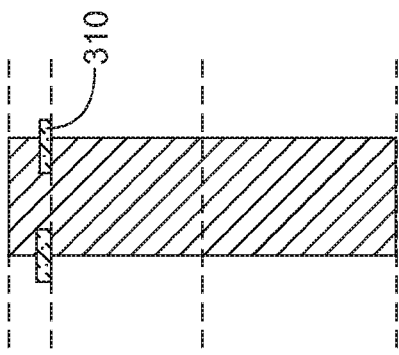

The wick stop shelves 240, 242, 310 may be relatively thin, e.g., a fraction of the thickness of the strata (i.e., layer thickness) in which the wick stop shelves 240, 242, 310 are built, FIGS. 2B, 3A. Alternatively or additionally, the wick stop shelf 312 may be the full thickness of the layer depending on, for example, device requirements and operation, FIG. 3B. For example Layer 3 of FIG. 2B may be 5 to 500 microns in thickness and may be formed from one layer containing materials of different heights of thicknesses or may be comprised of two sublayers, one formed to the height or thickness of wick stop shelf 240 and a second continuing past that height or thickness to complete the full thickness of Layer 3. Alternatively or additionally, the wick stop 252, 262 comprising a non-wetting material, may be disposed internally to a part 250, 260 so the wick stop 252, 262 is flush with, or recessed within, a surface 264 of the part 250, 260, FIG. 2C. In such configurations, the non-wetting nature of the wick stop 252, 262 may deter or stop the flow of solder without the need for a mechanical shelf which protrudes externally from the part 250 in which the wick stop 252, 262 is incorporated. The ability to stop the flow of solder without the use of a shelf configuration may be desirable in cases where potential breakage of a shelf is a concern, or where mechanical interference by the shelf or the dielectric material should be minimized. In the cases shown in FIGS. 2B and 2C, the wick-stop 252, 262 may be mechanically entrenched or interlocked into the central electrically conductive structure 250, 260 so that chemical adhesion alone is not required over the solder reflow temperature range.

The non-wetting wick stop shelves 230, 240, 242 may be formed as part of a multi-layer build process and/or any other suitable process. By way of example, the coaxial microstructure 200 may be fabricated by sequentially building Layers 1 and 2, after which the wick stop shelves 230, 240, 242 may be fabricated during the portion of the sequential build process which provides Layer 3. In particular, Layer 1 and Layer 2 may be formed by sequential build of sacrificial material and a plated and/or grown material, such as photoresist and copper electroplating. A photoresist mold, e.g., sacrificial material, is illustrated substantially removed in FIG. 2B. In addition, seed layers may be optionally applied after each layer, as needed. In Layer 3, for example, a seed layer may be applied to Layer 2. A dielectric may be applied and/or patterned, and this may be followed by another seed layer as needed. A sacrificial resist may be applied and/or planarized over a permanent dielectric. The resist may be patterned and then a conductive material, e.g., metal, in Layer 3 may be grown by electrodeposition, for example. Layer 3 may be planarized via CMP, for example, and more layers may be added as desired or needed. In one exemplary configuration, a permanent dielectric (or non-conductor or a material not wettable by the solder) 314 may be formed in multiple layers, such as two layers 316, 318, FIG. 3C. The first layer 316 may provide a mechanical anchor, and the second layer 314, formed after Layer 3, may provide a masking region and may also set a thickness for a solder or conductive adhesive applied to the interior region 340 of layer 318. The anchor 316 may substantially minimize adhesion failure of the second layer 314 in processing and/or use. However, if sufficient chemical adhesion can be obtained, the anchor 316 may be eliminated. Additionally or alternatively to a multi-layer build process, a non-wetting wick stop may be provided as a coating by atomic layer deposition, or other suitable processes, for example, over a conductive structure 250, 260. The coating may be patterned, such as by selective etching or other suitable technique, to provide non-wetting wick stop layer(s) on desired potions of the conductive structure 250, 260, such as at the locations illustrated in FIG. 2C, for example.

Figure 4B:
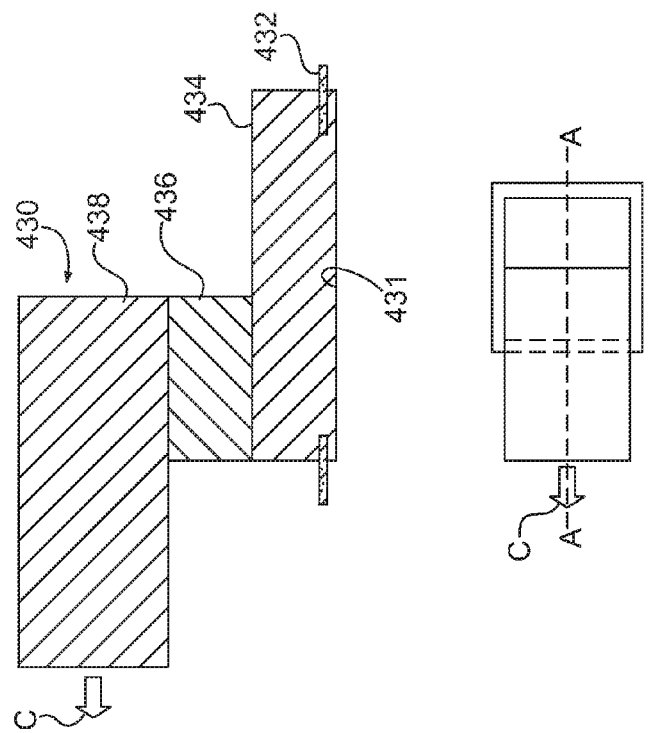
FIGS. 4A and 4B schematically illustrate top views and side cross-sectional views of exemplary three-dimensional microstructures incorporating wick stop structures in accordance with the present invention.
Figure 4A:
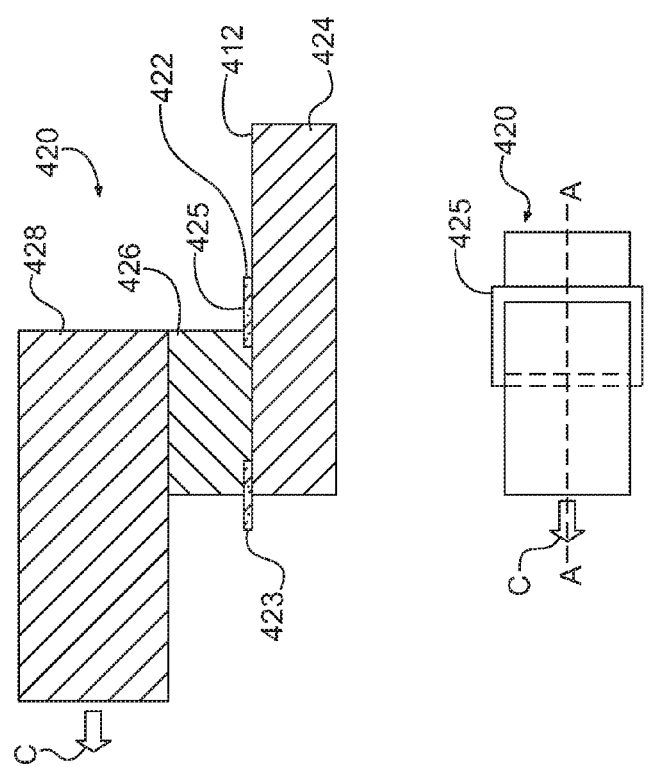

In view of the teaching of FIGS. 2A-2C, 3A-3C and the exemplary wick stop shelves/layers illustrated therein, solution to the problem illustrated in FIGS. 1A, 1B in accordance with one aspect of the present invention is illustrated in FIGS. 4A, 4B, in which respective three-dimensional microstructures 420, 430 are provided with wick stops 425, 432. Specifically FIG. 4A schematically illustrates a top down view and side cross-sectional view of the three-dimensional microstructure 420 which may be fabricated via a multilayer build process to comprise layers 424, 426, 428. (The arrow labeled "C" conceptually illustrates that additional portions of the three-dimensional microstructure 420 may extend from the portion of the microstructure 420 illustrated.) Proximate an upper surface 412 of layer 424 a wick stop 425 may be provided at a location which circumscribes layer 426. The wick stop layer 422 may comprise any of the exemplary materials discussed above and may be formed by any of the fabrication techniques discussed above in connection with FIGS. 2A-2C, 3A-3C. In particular, the wick stop 425 may include a wick stop shelf 423 extending beyond the perimeter of layer 424 to mechanically block the flow of solder upward from layer 424 onto layer 426. In addition, the wick stop 425 may include a wick stop layer 422 overlying the upper surface 412 of the layer 424 in a configuration where the wick stop layer 422 prevents or deters the flow of solder due to the non-wetting nature of the material from which the wick stop layer 422 is composed.

Figure 5A:
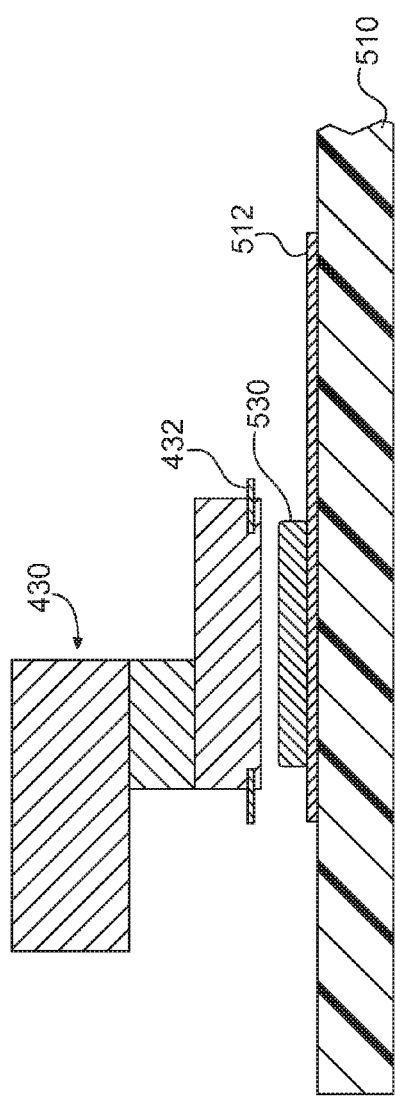
FIGS. 5A and 5B schematically illustrate the microstructure of FIG. 4B, pre- and post-soldering, respectively, demonstrating containment of solder flow in accordance with an aspect of the present invention.

In a further exemplary configuration in accordance with the present invention, FIG. 4B schematically illustrates a top down view and side cross-sectional view of a three-dimensional microstructure 430 which may be fabricated in a manner similar to that of microstructure 420 and which includes layers 434, 436, 438. (The arrow labeled "C" again conceptually illustrates that additional portions of the microstructure 430 may extend beyond that which is shown in FIG. 4B.) A wick stop shelf 432 may be provided near a lower surface 431 of layer 434, which may comprise any of the exemplary materials discussed above and may be formed by any of the fabrication techniques discussed above in connection with FIGS. 2A-2C, 3A-3C. The ability of the wick stop shelf 432 to deter or prevent the flow of solder is further illustrated in FIG. 5A which shows the three-dimensional microstructure 430 in position prior to assembly above base layer 510 to which the three-dimensional microstructure 430 is to be attached. The base layer 510 may include a circuit board, hybrid circuit, semiconductor device, a further three-dimensional structure, and/or any other suitable structure, and may include a metallic component 512 disposed thereon. Solder or solder paste 530 may be disposed intermediate the three-dimensional microstructure 430 and the metallic component 512. Upon melting, the solder 532 flows to mechanically and/or electrically connect the three-dimensional microstructure 430 to the metallic component 512 of the base layer 510. However, in contrast to the situation illustrated in FIG. 1B, the wick stop shelf 432 deters or prevents the flow of solder 532 upward past the wick stop shelf 432 along the surfaces of the three-dimensional microstructure 430, FIG. 5B.

Figure 5B:
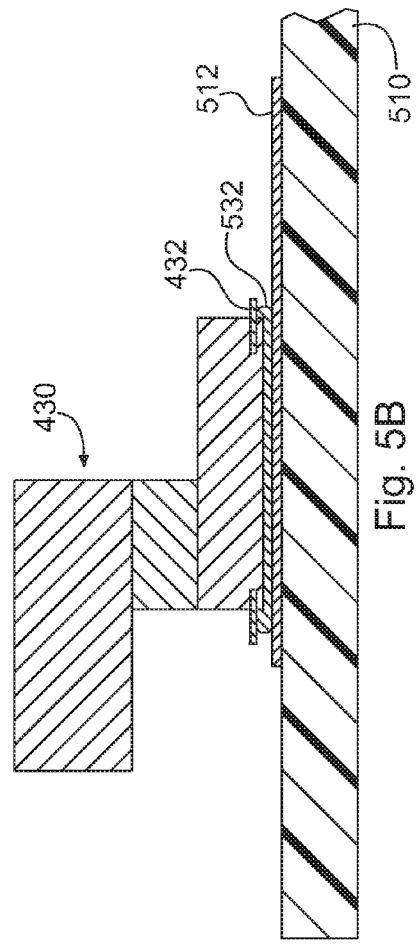
Figure 8E:
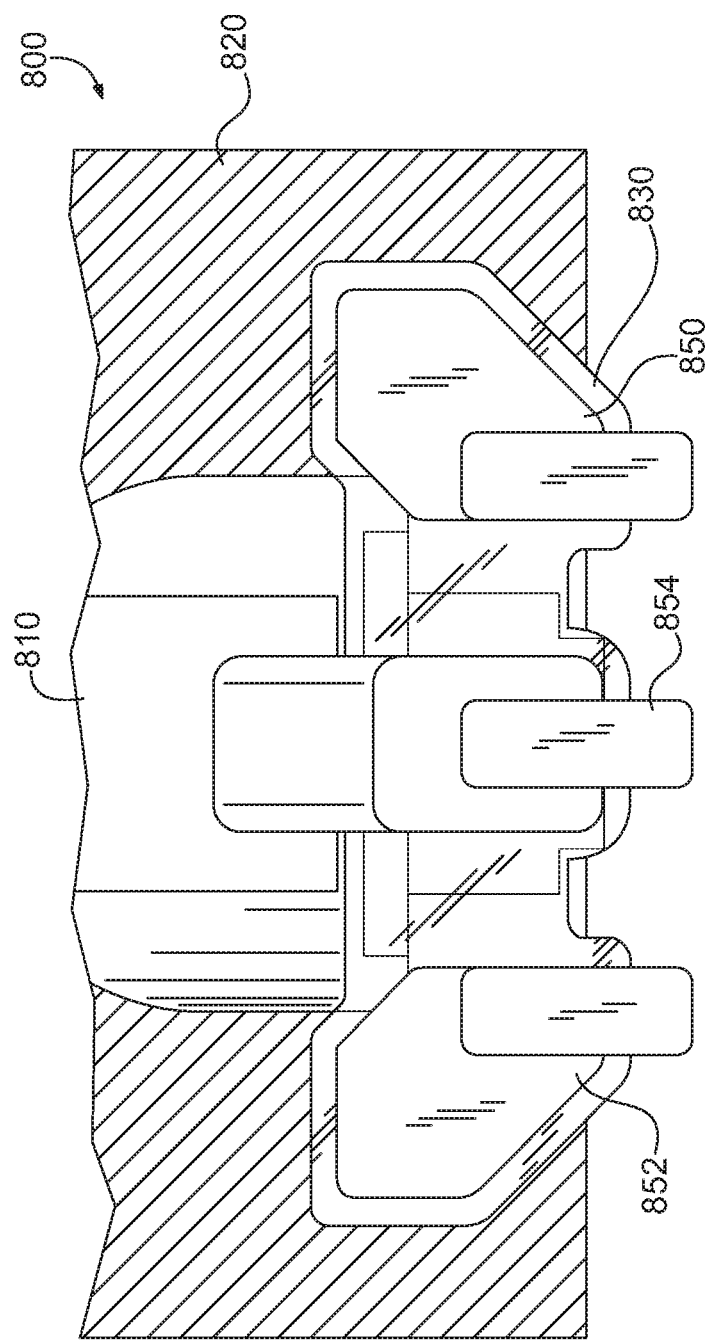
FIG. 8E schematically illustrates a bottom view of the coax to G-S-G microstructure of FIGS. 8A and 8B.

In yet a further aspect of the present invention, a three-dimensional microstructure 630 may be provided with stop pads 635 which may function to establish the thickness of a bonding material, such as a conductive epoxy (or solder) 633, FIG. 6. The stop pads 635 may also provide for direct or nearly direct contact between the microstructure 630 and the device to which is it is bonded, layer 612 on 610. Similar to the structures depicted in FIG. 5B, FIG. 6 schematically illustrates attachment of the three-dimensional microstructure 630 to a metallic part 612 of a base layer 610, which may include a circuit board, hybrid circuit, semiconductor device, a further three-dimensional structure, and/or any other suitable structure. Unlike the three-dimensional microstructure 530 of FIG. 5B, the three-dimensional microstructure 630 includes stop pads 635 disposed on a lower surface of the microstructure 630 at a location intermediate microstructure 630 and the metallic part 612 of the base layer 610. The stop pads 635 have a lateral height (or thickness) and, when seated in contact with the metallic part 612, provide bondline gaps 634 between the three-dimensional microstructure 630 and the metallic part 612, which gaps 634 have the same height as the stop pads 635 independent of the downward force used to attach the three-dimensional microstructure 630 to the metallic part 612. In addition, the stop pads 635 may maximize or enhance wetting in the contact region between the three-dimensional microstructure 630 and the metallic part 612. The conductive epoxy (or solder) 633 may fill the bond gaps 634 to attach the three-dimensional microstructure 630 to the metallic part 612. A wick (or flow) stop shelf 632 is also provided to cooperate with the bond gaps 634 to maintain the desired thickness of the conductive epoxy 633 at the periphery of the three-dimensional microstructure 630, while at the same time preventing or deterring flow of the solder or conductive epoxy 633 onto portions of the three-dimensional microstructure 630 disposed above the wick stop shelf 632. It should be noted that the material of stop pads 635 could be the same as that of other larger microstructure layers, or the non-wettable portion of 630, i.e., wick stop shelf 632, depending other aspects of the intended function, for example depending on the needs for the electrical conductivity and/or its thermal conductivity, and so on. For example if the bulk of microstructure 630 is copper and being used for its high electrical and thermal conductivity, having mechanical stop pads 635 also composed of copper would typically provide improved thermal and electrical conductivity between the microstructure 630 and the substrate 610 as copper typically has better electrical and thermal conductivity than solders or conductive epoxies.

By way of further example, FIG. 7A illustrates similar principles of the present invention, but in the context of three-dimensional microstructure junctions (i.e., exemplifying the situation where the base layer 610 is a three-dimensional microstructure). Specifically, first and second three-dimensional microstructures 720, 740, respectively, may be provided, each of which includes respective stop pads 725, 726, 745 and a respective wick stop shelf 722, 742. The stop pads 725, 726, 745 may mechanically cooperate to set bond gaps between the mating surfaces of the first and second three-dimensional microstructures 720, 740 for receiving a solder (or conductive epoxy) 730. Post assembly, each bond may be filled with a respective portion of the solder 731, 733, 735, FIG. 7B. The optional gaps shown between the stop pads 725, 726 may be used to allow excess conductive epoxy, solder, or any other bonding medium, e.g., solder 730, to flow in a controlled manner between non-wetting layers, wick stop shelves 722, 742. While shelves 722, 742 are not shown mechanically constrained as are the shelves 310 in FIG. 3A, the shelves 722, 742 may readily be so-constructed.

In another of its aspects, the present invention may be utilized in configurations relating to coaxial to ground-signal-ground (G-S-G) launch, such as for DC—100+ GHz launches. With reference to FIGS. 8A-8E, an exemplary coaxial microstructure 800 is illustrated having an outer conductor 820 and a center conductor 810 making a downward Z-transition. The center conductor 810 may be supported within the outer conductor 820 by a dielectric support 840 which may minimize upward and lateral motion of the center conductor 810 within the outer conductor 820. To provide termination of the coaxial microstructure 800 in a manner that facilitates mounting of the coaxial microstructure 800 to another device, such as on an MMIC or circuit board, for example, grounding feet 850, 852 may be provided in electrical communication with the outer conductor, and signal foot 854 may be provided in electrical communication with the center conductor 810. A dielectric wick stop 830 may be provided between the feet 850, 852, 854 and the center and the outer conductors 810, 820 to deter or prevent the flow of solder upward from the feet 850, 852, 854 onto the center and outer conductors 810, 820. In addition, the dielectric wick stop 830 may also provide support to the center conductor 810 to provide mechanical stability of the center conductor 810 relative to the outer conductor 820. Alternatively, the wick stop 830 may be provided as individual wick stops on each of the feet 850, 852, 854 using any suitable wick stop configuration, such as those depicted in FIGS. 2A-2C, 3A-3C, for example.

In certain configurations the coaxial microstructure 800 may serve as a jumper connecting two chips, and therefore the height of the terminal comprising the ground and signal feet 850, 852, 854 may be within the height of the outer conductor 820, FIGS. 8C, 8D. Alternatively, if the coaxial microstructure 800 were intended to be used in a surface mount application, the ground and signal feet 850, 852, 854 could be provided at a location such that the feet 850, 852, 854 are flush with the surface of the coaxial microstructure 800 or protrude from the surface of the coaxial microstructure 800.

In yet a further of its aspects, the present invention may be utilized in attach of SMT (surface-mount technology) devices or flip chip mounting applications. For example, with reference to FIGS. 9A-9B, application of the present invention to SMT mounting is illustrated in which microstructures such as electrical conductors 920, 940 lead to mounting pads or mounting surfaces, shown on base layer 910, such as a circuit board, ceramic substrate, IC, or lower layers of microstructures. Dielectric or non-wetting wick stop shelves 922, 942 may be provided proximate a surface of the mounting pads 920, 940 where surface mounting is to be effected, FIG. 9A. Upon application and melting of a solder 932, 934 a surface mount component 950, such as a resistor or capacitor, may be electrically and mechanically connected to the mounting pads 920, 940, FIG. 9B. Such solders may alternatively be already disposed on the mounting pads 920, 940 or the surface mount component's electrical mounting terminals. In such a configuration, the wick stop shelves 922, 942 deter or prevent the flow of solder downward beyond the mounting region onto the mounting pads 920, 940, and potentially onto the base layer 910. In a similar manner, the present invention may provide advantages in flip chip mounting, including multi-layer applications which allow parts to be mounted over one another. For example, a base layer 1010, such as a circuit board or hybrid microelectronic circuit, may include mounting pads 1020, 1030, 1040, 1050 of varying heights disposed thereon, FIG. 10A. Each mounting pad 1020, 1030, 1040, 1050 may include a respective dielectric wick stop shelf 1022, 1032, 1042, 1052 proximate a mounting surface of their respective mounting pads 1020, 1030, 1040, 1050. Chips 1060, 1070 may be flip chip mounted to the mounting pads 1020, 1030, 1040, 1050 using a solder, the flow which solder downward towards the base layer 1010 may be deterred or prevented by the wick stop shelves 1022, 1032, 1042, 1052, FIG. 10B.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. An electronic microstructure, comprising:
   a mounting surface having at least a portion thereof configured to bond to one or more of a metallic solder and a conductive epoxy;
   a wick stop structure disposed away from the mounting surface at a location on the microstructure proximate the mounting surface, the wick stop structure configured to deter a flow of one or more of the metallic solder and the conductive epoxy from the mounting surface to a location on the microstructure beyond the location of the wick stop structure, wherein the wick stop structure comprises a shelf which extends outwardly away from a surface of the microstructure at which the shelf is located.

2. The electronic microstructure according to claim 1, wherein the wick stop structure comprises a material which is non-wetting to metallic solder.

3. The electronic microstructure according to claim 1, wherein the wick stop structure comprises a material which is non-wetting to conductive epoxy.

4. The electronic microstructure according to claim 1, wherein the wick stop structure comprises a dielectric.

5. The electronic microstructure according to claim 1, wherein the wick stop structure comprises a non-wetting metal.

6. The electronic microstructure according to claim 5, wherein the non-wetting metal comprises nickel.

7. The electronic microstructure according to claim 1, wherein the wick stop structure comprises a metal oxide.

8. The electronic microstructure according to claim 1, wherein the shelf comprises a portion disposed within the microstructure.

9. The electronic microstructure according to claim 1, wherein the shelf circumscribes a portion of the microstructure.

10. The electronic microstructure according to claim 1, wherein the microstructure comprises a three-dimensional structure comprising multiple layers.

11. The electronic microstructure according to claim 10, wherein the mounting surface is disposed at a first layer of the multiple layers and wherein the shelf is disposed at a second layer of the multiple layers, wherein the second layer is disposed over the first layer.

12. The electronic microstructure according to claim 11, wherein the first and second layers are disposed in direct contact with one another.

13. The electronic microstructure according to claim 1, wherein the microstructure comprises a three-dimensional structure formed by a multi-layer build process.

14. The electronic microstructure according to claim 1, wherein the mounting surface comprises a raised surface to provide a mechanical stop between the mounting surface and a part to be mounted thereto.

15. The electronic microstructure according to claim 14, wherein the raised surface provides a gap of predefined height between the raised surface and mounting surface.

16. The electronic microstructure according to claim 1, wherein the metallic solder comprises a solder paste.

17. The electronic microstructure according to claim 1, comprising a chip flip-chip mounted to the mounting surface.

18. The electronic microstructure according to claim 1, comprising a surface mount component mounted to the mounting surface.

19. The electronic microstructure according to claim 1, wherein the shelf has a longitudinal axis which is oriented substantially parallel to the mounting surface.

20. An electronic microstructure, comprising:
    a mounting surface having at least a portion thereof configured to bond to one or more of a metallic solder and a conductive epoxy;
    a wick stop structure disposed away from the mounting surface at a location on the microstructure proximate the mounting surface, the wick stop structure configured to deter a flow of one or more of the metallic solder and the conductive epoxy from the mounting surface to a location on the microstructure beyond the location of the wick stop structure, wherein the wick stop structure is disposed internal to the microstructure at a surface of the microstructure.

21. The electronic microstructure according to claim 20, wherein the wick stop structure is recessed within the microstructure.

22. An electronic microstructure, comprising:
    a mounting surface having at least a portion thereof configured to bond to one or more of a metallic solder and a conductive epoxy;
    a wick stop structure disposed away from the mounting surface at a location on the microstructure proximate the mounting surface, the wick stop structure configured to deter a flow of one or more of the metallic solder and the conductive epoxy from the mounting surface to a location on the microstructure beyond the location of the wick stop structure, wherein the mounting surface comprises mounting feet to provide a G-S-G termination.

23. The electronic microstructure according to claim 22, wherein the wick stop structure is disposed proximate the mounting feet.

24. An electronic microstructure, comprising:
    a mounting surface having at least a portion thereof configured to bond to one or more of a metallic solder and a conductive epoxy;
    a wick stop structure disposed away from the mounting surface at a location on the microstructure proximate the mounting surface, the wick stop structure configured to deter a flow of one or more of the metallic solder and the conductive epoxy from the mounting surface to a location on the microstructure beyond the location of the wick stop structure, wherein the microstructure comprises a coaxial microstructure.

25. A method of forming an electronic structure comprising:
    (a) depositing a plurality of layers over a substrate, wherein the layers comprise one or more of a metal material, a sacrificial photoresist material, and a dielectric material, thereby forming an electronic structure above the substrate, the structure comprising the microstructure of claim 1, wherein the wick stop structure comprises a selected one of the plurality of layers; and
    (b) removing the microstructure from the substrate to provide a freestanding part.

26. The method according to claim 25, wherein the wick stop structure comprises a material which is non-wetting to metallic solder.

27. The method according to claim 25, wherein the wick stop structure comprises a material which is non-wetting to conductive epoxy.

28. The method according to claim 25, wherein the wick stop structure comprises a dielectric.

29. The method according to claim 25, wherein the wick stop structure comprises a non-wetting metal.

30. The method according to claim 29, wherein the non-wetting metal comprises nickel.

31. The method according to claim 25, wherein the wick stop structure comprises a metal oxide.

32. The method according to claim 25, wherein the wick stop structure comprises a shelf which extends outwardly away from a surface of the microstructure at which the shelf is located.

33. The method according to claim 32, wherein the shelf comprises a portion disposed within the microstructure.

34. The method according to claim 32, wherein the shelf circumscribes a portion of the microstructure.

35. The method according to claim 25, wherein the wick stop structure circumscribes a portion of the microstructure.

36. The method according to claim 25, wherein the wick stop structure is disposed internal to the microstructure at a surface of the microstructure.

37. The method according to claim 36, wherein the wick stop structure is recessed within the microstructure.

38. The method according to claim 25, wherein the microstructure comprises a three-dimensional structure comprising multiple layers.

39. The method according to claim 25, wherein the microstructure comprises a three-dimensional structure formed by a multi-layer build process.

40. The method according to claim 25, wherein the mounting surface comprises a raised surface to provide a mechanical stop between the mounting surface and a part to be mounted thereto.

41. The method according to claim 25, wherein the mounting surface comprises mounting feet to provide a G-S-G termination.

42. The method according to claim 41, wherein the wick stop structure is disposed proximate the mounting feet.

43. The method according to claim 25, wherein the microstructure comprises a coaxial microstructure.

44. The method according to claim 25, wherein the metallic solder comprises a solder paste.

45. The method according to claim 25, comprising a chip flip-chip mounted to the mounting surface.

46. The method according to claim 25, comprising a surface mount component mounted to the mounting surface.

* * * * *